United States Patent
Shive et al.

(10) Patent No.: US 7,696,103 B2
(45) Date of Patent: Apr. 13, 2010

(54) METHOD FOR PURIFYING SILICON CARBIDE COATED STRUCTURES

(75) Inventors: Larry Wayne Shive, St. Charles, MO (US); Brian Lawrence Gilmore, O'Fallon, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 11/755,472

(22) Filed: May 30, 2007

(65) Prior Publication Data
US 2007/0221609 A1    Sep. 27, 2007

Related U.S. Application Data

(62) Division of application No. 10/900,938, filed on Jul. 27, 2004.

(51) Int. Cl.
*H01L 21/302* (2006.01)
(52) U.S. Cl. ............... 438/745; 438/706; 438/770; 117/9
(58) Field of Classification Search ........... 438/706, 438/745, 767, 779, 770, 769; 117/9, 13, 117/21, 10
See application file for complete search history.

(56) References Cited

U.S. PATENT DOCUMENTS

| 5,069,724 | A | * | 12/1991 | Kobayashi et al. ........... 134/37 |
| 5,272,121 | A | | 12/1993 | Mizutani et al. |
| 5,494,439 | A | * | 2/1996 | Goldstein et al. ........... 432/253 |
| 5,770,324 | A | | 6/1998 | Holmes |
| 6,294,444 | B1 | * | 9/2001 | Ueno ................. 438/514 |
| 6,579,833 | B1 | * | 6/2003 | McNallan et al. ........... 508/100 |
| 6,699,401 | B1 | | 3/2004 | Horiuchi et al. |
| 6,815,299 | B2 | | 11/2004 | Kiritani |
| 6,878,451 | B2 | | 4/2005 | Asayama et al. |
| 2002/0052102 | A1 | * | 5/2002 | Kiritani ................. 438/590 |
| 2002/0144642 | A1 | | 10/2002 | Sreedharamurthy |
| 2005/0148455 | A1 | * | 7/2005 | Narendar et al. ............ 501/88 |
| 2006/0234058 | A1 | | 10/2006 | Ohmi et al. |

FOREIGN PATENT DOCUMENTS

| EP | 1452508 A1 | 9/2004 |
| JP | 10245266 A | 9/1998 |
| JP | 2003224122 A | 8/2003 |
| JP | 2003277933 A | 10/2003 |
| WO | 03040059 A1 | 5/2003 |

OTHER PUBLICATIONS

PCT International Search Report for PCT/US2005/010925 dated Oct. 20, 2005, 5 pages.
S.J. Pearton, "Dry Etching of SiC," Department of Materials Science and Engineering, University of Florida, Gainesville, FL 32611, USA, pp. 1-31, http://www.mse.ufl.edu/~spear/recent papers/Dry Etch Sic.htm.

* cited by examiner

*Primary Examiner*—Lan Vinh
(74) *Attorney, Agent, or Firm*—Armstrong Teasdale LLP

(57) ABSTRACT

Processes for the purification of silicon carbide structures, including silicon carbide coated silicon carbide structures, are disclosed. The processes described can reduce the amount of iron contamination in a silicon carbide structure by 100 to 1000 times. After purification, the silicon carbide structures are suitable for use in high temperature silicon wafer processing.

24 Claims, No Drawings

METHOD FOR PURIFYING SILICON CARBIDE COATED STRUCTURES

REFERENCE TO RELATED APPLICATIONS

This application claims priority from U.S. application Ser. No. 10/900,938 filed on Jul. 27, 2004, the entire disclosure of which is incorporated herein by reference.

BACKGROUND OF INVENTION

The present invention is directed to a method for purifying silicon carbide structures useful in high temperature silicon wafer manufacturing processes. More particularly, the present invention is directed to a method for reducing the iron content of a silicon carbide structure suitable for use in a high temperature silicon wafer manufacturing process. The method results in silicon carbide structures having a substantially iron-free denuded zone at their surface that will not diffuse a problematic amount of iron into the silicon wafer atmosphere during high temperature silicon wafer processing steps.

Silicon carbide structures or parts are generally used inside of a furnace during the high temperature processing of silicon wafers. These parts, commonly referred to as boats, have intimate contact with the silicon wafers as they actually hold the wafers in place during numerous processing steps. Silicon carbide substrates are advantageous for this application for several reasons, including: (1) they can be used for very long periods of time at temperatures exceeding 1150° C. without loosing any dimensional tolerances; (2) they are highly chemically inert; and (3) they are extremely strong. Because of these characteristics, silicon carbide is the preferred substrate material for all high temperature silicon wafer thermal processing.

Silicon carbide substrates generally contain a relatively high level of impurities, such as iron, because they tend to be highly porous, which results in more surface area that can trap impurities and make them hard to remove. Because of this, many silicon carbide structures are coated with a very high purity silicon carbide coating prior to use. This silicon carbide coating is much more dense than the substrate, which reduces the porosity of the surface. The purity of the silicon carbide coating introduced onto the silicon carbide structure, however, can present a major problem at the high temperatures required for some silicon wafer thermal treatment processes. For example, when silicon wafers are processed at temperatures equal to or greater than about 1200° C. in an argon/hydrogen or oxygen/nitrogen atmosphere, iron present in the surface layers or bulk of the silicon carbide coating can diffuse from the silicon carbide coating and into the silicon wafers, resulting in unacceptably high levels of iron contamination in the silicon wafers. The bulk iron content of a high purity silicon carbide coating introduced onto a substrate by chemical vapor deposition is typically about 0.1 to about $10 \times 10^{15}$ atoms/cm$^3$. Iron concentrations of $10^{13}$ iron atoms/cm$^3$ have been commonly observed in silicon wafers processed in commercially available silicon carbide coated boats. This level of contamination is about 1000 times higher than most silicon wafer users will accept.

One solution to the contamination problem would be for the silicon carbide coated boat manufacturers to deposit by chemical vapor deposition a silicon carbide coating onto the substrate that is at least about 1000 times more pure with respect to iron than the currently utilized coating. Although this would potentially solve the iron-contamination problem, such hyper-pure silicon carbide coatings, if commercially available, are extremely expensive and easily contaminated by the machining processes required after deposition. Further, the analytical methods to directly verify such ultra-high purity are not available.

One solution practiced in the industry to date to reduce the iron contamination in silicon carbide boats has been to grow a relatively thick silicon dioxide layer on the surface of the silicon carbide, which is typically done in the presence of a chlorine containing gas such as hydrogen chloride (HCl) or dichloroethylene alone or in combination with oxygen. This oxide layer acts as an iron diffusion barrier and keeps the iron in the silicon carbide below the oxide layer from outdiffusing and reaching the silicon wafer resting on top of the grown oxide layer. There are two main problems with this approach. First, some of the iron in the silicon carbide layer that is oxidized is captured at the top surface of the oxide layer and contaminates the silicon wafer through outdiffusion during processing. Second, the oxide layer is etched away by some processing ambients, such as hydrogen, and leaves the silicon wafers directly exposed to the contaminated silicon carbide. Re-oxidizing the silicon carbide layer intermittently results in the loss of valuable processing time and increased overall cost. Also, this re-oxidation again traps iron at the surface, which can be released during processing as noted above.

An alternative approach to reducing contamination in silicon carbide structures includes etching at least about 0.1 micrometers but no more than about 10 micrometers of silicon carbide from the surface using a gaseous chlorine trifluoride (ClF$_3$) etching process. This process is typically carried out at a temperature of from about 20° C. to about 600° C. Although this process does remove iron contamination found in the surface layers of the silicon carbide coating, it is generally not capable of removing iron contamination from the bulk of the structure or any silicon carbide coating. This bulk iron can diffuse to the surface of the structure or coating during wafer processing and into the environment surrounding the wafers processed.

Another approach to reducing contamination originating from silicon carbide structures and coatings includes utilizing extensive in-situ cleaning processes to reduce the amount of iron contamination present in the silicon carbide. Typical cleaning processes include at least two steps. The first step is an oxidation of the silicon carbide coating in a furnace in the presence of hydrogen chloride gas or dichloroethylene (with oxygen) at a temperature greater than about 950° C. This step results in the formation of iron chloride in the silicon carbide, which is volatile species that can vaporize from the silicon carbide under certain conditions.

The second step in the in-situ cleaning process involves a series of from about 10 to about 20 furnace processing cycles at a normal silicon wafer processing temperature of from about 1200° C. to about 1350° C. with fresh, low iron silicon wafers included in each run. The atmosphere is typically hydrogen, a mixture of hydrogen and argon, or argon only. The fresh low iron silicon wafers are used to extract the iron from the silicon carbide layer during the processing steps. The progress of boat purification is monitored indirectly by measuring the iron content of the silicon wafers exposed to the silicon carbide coated boat with surface photovoltage. Generally, the boat purification and qualification is complete when the iron content in the thermally processed silicon wafers is less than about $10^{10}$ iron atoms/cm$^3$ as measured by surface photovoltage.

Although this in-situ cleaning process does produce high quality silicon carbide boats that will not cause significant iron contamination during high temperature silicon wafer processing, it is very time consuming and expensive. In some cases, more than $100,000 worth of fresh silicon wafers must be sacrificed to produce a purified boat. Also, such purification may require 5 or more furnace runs, which can also significantly increase resulting costs.

As such, a need exists in the industry for methods to purify silicon carbide structures suitable for use in high temperature silicon wafer manufacturing processes in a less costly, time efficient manner. Also, it would be advantageous if the method did not require the sacrifice of a significant number of first quality silicon wafers.

SUMMARY OF THE INVENTION

The present invention is directed to methods for purifying a silicon carbide structure suitable for use in high temperature silicon wafer manufacturing processes by creating a substantially iron-free denuded zone of a desired depth from the surface of the silicon carbide inward. The disclosed methods use conventional purification steps in a novel sequence and qualify silicon carbide structures for use in high temperature silicon wafer manufacturing processes with significantly fewer furnace runs as compared to previously known methods. Also, the novel sequences significantly reduce or eliminate the number of first quality silicon wafers that need to be sacrificed to purify a silicon carbide structure. After purification, the silicon carbide structures can be used at elevated temperatures in any ambient that is compatible with the basic chemical properties of silicon carbide without outgassing a substantial amount of iron into the surrounding environment.

As such, the present invention is directed to a process for purifying a silicon carbide structure suitable for use in high temperature silicon wafer processing. The process comprises: (a) subjecting the silicon carbide structure to moisture; (b) chemically stripping at least about 1 micrometer of silicon carbide from the silicon carbide structure; (c) exposing the silicon carbide structure to hydrogen gas at a temperature of at least about 1200° C. for a time period of from about 1 hour to about 100 hours; (d) growing a silicon oxide layer having a thickness of from about 2 nanometers to about 400 nanometers on the surface of the silicon carbide coated structure at a temperature of from about 1150° C. to about 1250° C.; (e) chemically stripping the silicon oxide layer from the silicon carbide structure; and (f) repeating steps c, d, and e from about 1 to about 4 times.

The present invention is further directed to a high purity silicon carbide structure suitable for use in high temperature silicon wafer manufacturing comprising a silicon carbide structure, the silicon carbide structure comprising no more than about $1 \times 10^{12}$ atoms of iron/cm$^3$, the silicon carbide structure being prepared by a process comprising (a) subjecting the silicon carbide structure to moisture; (b) chemically stripping at least about 1 micrometer of silicon carbide from the silicon carbide structure; (c) exposing the silicon carbide structure to hydrogen gas at a temperature of at least about 1200° C. for a time period of from about 1 hour to about 100 hours; (d) growing a silicon oxide layer having a thickness of from about 2 nanometers to about 400 nanometers on the surface of the silicon carbide structure at a temperature of from about 1150° C. to about 1250° C.; (e) chemically stripping the silicon oxide layer from the silicon carbide structure; and (f) repeating steps c, d, and e from about 1 to about 4 times.

Other features of the present invention will be in part apparent and in part pointed out hereinafter.

DETAILED DESCRIPTION OF THE PREFERRED EMBODIMENT

The present invention is generally directed to a method of purifying a silicon carbide structure by creating a substantially iron-free denuded zone of a desired depth from the outer surface inward. Generally, a denuded zone substantially free of iron of up to about 25 micrometers in thickness is created from the outer surface of the structure inward to reduce the amount of iron released into the atmosphere during use of the silicon carbide structure in high temperature processes. Surprisingly, it has been discovered that conventional silicon carbide purifying steps can be utilized in a novel sequence to produce high purity silicon carbide structures in a time and cost efficient manner. Once subjected to the methods described herein, the silicon carbide structures can be utilized in high temperature silicon wafer manufacturing processes without the need for conventional lengthy and expensive in-situ cleaning steps.

As used herein, the term "silicon carbide structure" is meant to include four different types of silicon carbide-based parts suitable for use in high temperature silicon wafer processes. First, the term includes silicon carbide parts comprising a silicon carbide base structure that has a high purity silicon carbide coating applied thereto to produce a silicon carbide coated silicon carbide substrate. Generally, these structures have the silicon carbide coating introduced onto the silicon carbide base structure by a chemical vapor deposition process. The silicon carbide coating that is applied to the silicon carbide base structure is a high purity silicon carbide coating generally having a thickness of from about 30micrometers to about 200 micrometers, suitably from about 50 micrometers to about 80 micrometers. The silicon carbide coating is generally of much higher purity with regards to iron as compared to the base substrate. Additionally, the silicon carbide coating is much more dense that the silicon carbide substrate and has significantly less porosity on its surface for impurities to penetrate into. With the process of the present invention as described herein, it is this silicon carbide coating that is purified in this embodiment.

Second, the term includes silicon carbide parts that are comprised of silicon carbide without a high purity silicon carbide coating. These silicon carbide parts are generally formed by slip casting high purity granular silicon carbide into a suitable shape and high temperature sintering the slip casting to form the desired shaped part. Typically, the slip casted silicon carbide part will then be subjected to a silicon treatment to introduce silicon onto and into the top layers of the slip casted part to reduce the porosity of the surface of the silicon carbide and then machined to its final shape. The processes of the present invention are used to purify the outermost layers of the slip casted silicon carbide part.

Third, the term includes silicon carbide parts that are comprised of silicon carbide that are manufactured by first introducing a thick layer of silicon carbide of high purity onto a high purity graphite substrate, which is of desirable shape. Once the silicon carbide coating is introduced onto the graphite substrate, the graphite substrate is burned away leaving only the silicon carbide, which is shaped into the desired shape. This produces a high quality silicon carbide part with low porosity. The processes of the present invention are used to purify this silicon carbide part.

Fourth, the term includes silicon carbide parts that are comprised of silicon carbide that are prepared by making a graphite substrate into a desired shape and subsequently converting the shaped graphite to silicon carbide chemically to produce a silicon carbide structure. The chemical means used to chemically convert the shaped graphite into silicon carbide can include exposure to silicon or sand, or a combination thereof. These silicon carbide parts can either be used neat, or may comprise a high purity silicon carbide coating as described above.

As noted above, in the first step of the purifying process, the silicon carbide structure is exposed to moisture. The structure may be immersed in water at room temperature or elevated temperature or may be exposed to normal humidity at room temperature or elevated temperature to allow the silicon carbide to absorb water into the grain boundaries. It is preferred that the moisture used be highly pure, and substantially free of iron, molybdenum and other transition metals to avoid the introduction of additional contaminants into the silicon carbide coating. The amount of time that the silicon carbide coated structure is subjected to the moisture is not narrowly critical and can be for example, 1 hour, 4 hours, 8 hours, 10 hours, 20 hours, or even 24 hours. This water absorption into the grain boundaries of the silicon carbide makes oxygen chemically available to the various iron species present therein. This oxygen will react with the various iron-containing species present in the silicon carbide, such as for example, iron silicide (FeSi) and iron carbide ($Fe_3C$) to form iron oxide (FeO), which, in subsequent processing steps, is easily converted to Fe(0) as shown in the following equations:

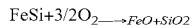

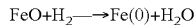

Fe(0) has a much higher mobility in silicon carbide as compared to iron silicide or iron carbide. As such, Fe(0) can be made to more easily diffuse toward the surface of the silicon carbide in subsequent processing steps where it can be removed from the surface layers.

Alternatively, oxygen can be made available to the various iron-containing species in the silicon carbide by exposing the silicon carbide structure to dry air substantially free of moisture. The dry air comprises oxygen that can penetrate into the grain boundaries and react with the various iron-containing species described above. The dry air may comprise from about 1% oxygen to about 100% oxygen.

After moisture has been introduced into the grain boundaries of the silicon carbide, the silicon carbide is subjected to a chemical stripping or etching process to remove at least about 1 micrometer and suitably from about 1 micrometer to about 20 micrometers, more suitably from about 1 micrometer to about 6 micrometers, and more suitably from about 2 micrometers to about 4 micrometers of the silicon carbide. This chemical stripping removes the outermost layers of the silicon carbide which, due to the nature of many processes, including chemical vapor deposition processes, typically contains a much higher concentration of iron as compared to the bulk of the silicon carbide. Generally, this higher level of contamination is primarily related to the purity of the furnace where the chemical vapor deposition process is completed.

The chemical stripping or etching of the outermost layers of the silicon carbide can be completed using one of two methods. In one method, the silicon carbide structure is exposed to an etching gas at a temperature greater than about 1000° C., suitably from about 1000° C. to about 1350° C., more suitably from about 1000° C. to about 1200° C., for a period of time of from about 10 minutes to about 2 hours to remove the desired amount of silicon carbide which may be, for example, at least about 1 micrometer and suitably from about 2 micrometers to about 4 micrometers, as noted above. Suitable etching gases are known in the art and may include, for example, any halide containing gas such as a chlorine gas, HCl, $SF_6$, and the like. Also, combinations of etching gases may be utilized. Additionally, the etching gas may be chlorine trifluoride ($ClF_3$). When this etching gas is used, the temperature for etching is typically from about 20° C. to about 600° C.

Generally, the etching gas reacts with the silicon carbide to form volatile species such as silicon tetrachloride and/or carbon tetrachloride that volatilize off of the surface of the coating during etching. The etching is preferably done under conditions that result in isotropic etching to maintain an appropriate surface on the silicon carbide structure.

The etching gas or gases utilized generally has a flow percentage in the etching furnace of from about 1% to about 100%, suitably from about 30% to about 100% of the total gas flow rate, which can be, for example, about 1 SLM to about 100 SLM, suitably from about 5 SLM to about 50 SLM, and more suitably from about 8 SLM to about 40 SLM. When the flow rate of the etching gas or gases is less than 100% of the total flow rate, gases such as argon, nitrogen, or a combination of argon and nitrogen can be used as the carrier gas.

Along with the etching gas, plasma may also be used to assist in the etching; that is, plasma may be turned on during the etching step to create free radical species on the surface of the silicon carbide coating, which are also volatile and are removed from the surface of the silicon carbide coating. Plasma etching may also assist in assuring that the overall removal of silicon carbide is isotropic. With plasma etching, any one of a number of organic or inorganic fluorides, chlorides, and/or bromides alone or in combination can be used to react with the silicon carbide layer to form various volatile products that evaporate from the surface.

In the second suitable method of stripping silicon carbide from the surface, the desired amount silicon carbide to be removed from the surface is oxidized on the surface and subsequently chemically stripped off. A suitable oxidation process includes introducing oxygen and nitrogen and/or argon, or a combination of dichloroethylene and oxygen with nitrogen or argon at a temperature of about 1000° C. or more for a time sufficient to oxidize the desired amount of surface silicon carbide. A sufficient time may be, for example, from one hour to several hundred hours, or longer, depending on the amount of silicon carbide to be oxidized. When oxygen is used in combination with nitrogen and/or argon, the flow percentage of the oxygen is typically from about 1% to about 99% of the total flow rate, suitably from about 10% to about 99% of the total flow rate. When oxygen is used with dichloroethylene, the flow percentage of oxygen is suitably from about 97% to about 99.5%, with the remainder being dichloroethylene and nitrogen or argon. In some embodiments, oxygen may comprise about 100% of the total gas flow rate.

This oxidation step creates silicon dioxide on the surface of the silicon carbide structure, which is subsequently removed with an aqueous stripping or etching compound. A suitable aqueous etching compound is a hydrofluoric acid solution. The hydrofluoric acid solution may suitably have a concentration of from about 1% (by weight) to about 49% (by weight).

Generally, the chemical stripping is preferably completed by utilizing the etching gas method described above as this process does not require that the silicon carbide structure be removed from the furnace between the etching step and subsequent processing steps. Because removal from the furnace is not required, the chance for further contamination of the silicon carbide structure during the chemical etching is significantly reduced or eliminated. Additionally, during the chemical etching process, iron silicide that is present in the grain boundaries is also converted to iron oxide by the moisture that diffused into the grain boundaries during the first step of the process. As noted herein, this iron oxide is then easily converted to Fe(0) in subsequent processing steps, which is easily volatilized out of the silicon carbide coating.

After the top layer of silicon carbide has been stripped off as described above, the silicon carbide structure is subjected to a high temperature hydrogen annealing treatment for an extended period of time to facilitate purification of the silicon carbide. The hydrogen treatment, or hydrogen anneal, may be done with a flow percentage of hydrogen of from about 1% to about 100%, suitably from about 1% to about 4%, with the remainder being argon and/or nitrogen. Generally, the lower percentages of hydrogen are preferred to stay below the lower explosive limit of hydrogen.

The hydrogen anneal is at a temperature of greater than about 1200° C. and lasts for from about 1 hour to about 100 hours, suitably from about 10 hours to about 24 hours. The longer the silicon carbide structure is held in the high temperature hydrogen anneal, the deeper the substantially iron-free zone, or "denuded zone," will be in the silicon carbide structure.

During this high temperature hydrogen treatment, iron oxide that is present in the silicon carbide is converted to Fe(0), which, as noted above, has a much higher diffusivity in silicon carbide and can more easily move to the silicon carbide surface where it can be removed by etching or be volatilized out of the silicon carbide and into the surrounding atmosphere to enhance purity. Additionally, during this high temperature hydrogen treatment, other iron species present in the individual silicon carbide grains move to the grain boundaries where they can react with silicon to form iron silicide molecules. Upon the addition of moisture in subsequent purifying steps, these iron silicide molecules react with water and iron oxide is formed. This iron oxide can easily be made into Fe(0) and volatilized out of the silicon carbide or captured with an oxide layer as described herein.

After the high temperature hydrogen treatment is complete, a thin oxide layer is then grown on the surface of the silicon carbide to capture surface iron that migrated to the surface during the high temperature hydrogen annealing. Various iron containing species may be captured in the oxide layer including Fe(0), iron silicide, and iron carbide. The oxide layer may suitably be grown on the silicon carbide layer in an atmosphere of oxygen or a combination of oxygen and argon at a temperature of from about 950° C. to about 1300° C., suitably from about 1150° C. to about 1250° C., suitably about 1200° C. for a period of from about 6 hours to about 10 hours, suitably about 8 hours. The oxide layer may be from about 2 nanometers to about 400 nanometers thick in order to capture the iron species at the desired depth.

After the thin oxide layer has been grown on the silicon carbide structure, the silicon carbide structure is removed from the furnace and chemically etched with an aqueous etchant to strip the oxide layer, and the iron species contained therein, from the silicon carbide structure. A suitable aqueous etchant is an aqueous solution of dilute hydrofluoric acid that may contain from about 0.05% (by weight) to about 49% (by weight) hydrofluoric acid.

Typically, the dilute hydrofluoric acid etching solution is maintained at a temperature of from about 15° C. to about 90° C. Within this range, the temperature will more typically be at least about 20° C. and no more than about 85° C. The silicon carbide structure is etched in the aqueous solution for a time period of from about 1 minute to about 4 hours until the oxide layer containing the various iron species is removed. This etching dissolves the oxide layer and the surface iron species contained therein that diffused from the bulk of the silicon carbide to the surface during the high temperature hydrogen process described above. Additionally, the exposure of the silicon carbide to the water contained in the aqueous etching solution allows the grain boundaries to again fill with water and allows access to oxygen by the remaining iron species in the coating. As described above, this results in the formation of iron oxide in the silicon carbide.

In some embodiments, additional acids may be used in combination with the hydrofluoric acid to etch the oxide layer and enhance iron removal. For example, dilute nitric acid and/or dilute hydrochloric acid in amounts up to about 20% (by weight), and suitably from about 1% (by weight) to about 10% (by weight) of the etching solution may be used in combination with the hydrofluoric acid to etch the oxide layer. Some iron species present in the oxide layer may have higher solubilities in these additional acids and, as such, these additional acids may facilitate further removal of iron. After the aqueous etching is complete, the substrate is typically thoroughly rinsed with deionized water and dried prior to further processing.

Once the oxide layer has been stripped away, the silicon carbide structure is re-introduced into the furnace and the three steps of (1) hydrogen annealing for extended period of time at elevated temperature; (2) the growth of an oxide layer having a thickness of from about 2 nanometers to about 400 nanometers; and (3) the chemical stripping of the oxide layer with a dilute aqueous etchant are repeated from about 1 to about 4 times to further purify the silicon carbide structure. The number of times that the three steps are repeated will depend upon the initial silicon carbide purity and the desired final denuded zone depth and purity of the silicon carbide structure prior to use in high temperature silicon wafer processing.

Generally, the purifying processes of the present invention are discontinued when the silicon carbide structure has a denuded zone of from about 5 micrometers to about 25 micrometers, suitably from about 5 micrometers to about 10 micrometers; that is, the processes are discontinued when the outermost about 5 micrometers to about 25 micrometers, suitably about 5 micrometers to about 10 micrometers of silicon carbide are substantially free of iron. By "substantially free of iron" it is meant that the desired region contain no more than about $1 \times 10^{12}$ atoms of iron/cm$^3$, and suitably no more than about $1 \times 10^{11}$ atoms of iron/cm$^3$. The processes of the present invention thus reduce the amount of iron in the desired range of silicon carbide by from about 100 times to about 1000 times or more as compared to silicon carbide structures coming from the manufacturer.

After the process of the present invention is complete and the amount of iron in the denuded zone of the silicon carbide has been reduced to the desired amount, the silicon carbide structure is ready to be used by an end user in a high temperature silicon wafer manufacturing process after a conventional bake out procedure is complete. This bake out procedure is completed to properly dry the silicon carbide structure and includes a conventional drying process in a diffusion furnace. After the bake out is complete, the silicon carbide structure may be loaded with fresh, low-iron silicon wafers and used in a high temperature silicon wafer manufacturing process. Samples of the after-process product are then typically analyzed for iron level to confirm that the silicon carbide structure is not introducing unwanted iron into the silicon wafer during high temperature processing. If the iron level in the processed wafers is too high, the processes of the present invention may be employed one, two, or even three more times to reduce the iron content in the silicon carbide structure.

In view of the above, it will be seen that the several objects of the invention are achieved and other advantageous results obtained.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A process for purifying a silicon carbide structure suitable for use in high temperature silicon wafer processing, the process comprising:
    a. subjecting the silicon carbide structure to moisture;
    b. chemically stripping at least about 1 micrometer of silicon carbide from the silicon carbide structure;
    c. exposing the silicon carbide structure to hydrogen gas at a temperature of at least about 1200° C. for a time period of from about 10 hours to about 24 hours;
    d. growing a silicon oxide layer having a thickness of from about 2 nanometers to about 400 nanometers on the surface of the silicon carbide structure at a temperature of from about 1150° C. to about 1250° C.;
    e. chemically stripping the silicon oxide layer from the silicon carbide structure using an aqueous etchant; and
    f. repeating steps c, d, and e from about 1 to about 4 times.

2. The process as set forth in claim 1 wherein the silicon carbide structure is subjected to moisture by immersing the structure in water.

3. The process as set forth in claim 1 wherein the silicon carbide structure is subjected to moisture by exposing the structure to humidity.

4. The process as set forth in claim 1 wherein in step b from about 1 micrometer to about 20 micrometers of silicon carbide is chemically stripped.

5. The process as set forth in claim 1 wherein in step b from about 2 micrometers to about 4 micrometers of silicon carbide is chemically stripped.

6. The process as set forth in claim 1 wherein step b is completed by etching the silicon carbide structure at a temperature of at least about 1000° C. for a time period of from about 10 minutes to about 2 hours in a halide containing gas.

7. The process as set forth in claim 6 wherein the etching temperature is from about 1000° C. to about 1350° C.

8. The process as set forth in claim 6 wherein the halide containing gas is selected from the group consisting of chlorine gas, hydrogen chloride gas, $SF_6$ and combinations thereof.

9. The process as set forth in claim 6 wherein plasma is used in combination with the halide containing gas to etch the silicon carbide structure.

10. The process as set forth in claim 9 wherein the plasma is created using a gas selected from the group consisting of organic or inorganic fluorides, organic or inorganic chlorides and organic and inorganic bromides.

11. The process as set forth in claim 4 wherein step b is completed by etching the silicon carbide structure at a temperature of from about 20° C. to about 600° C. in an atmosphere comprising $ClF_3$.

12. The process as set forth in claim 1 wherein step b is completed by first oxidizing the silicon carbide structure and then chemically stripping the oxidized layer.

13. The process as set forth in claim 12 wherein the oxidation comprises exposing the silicon carbide structure to a mixture of dichloroethylene and oxygen at a temperature of at least about 1000° C.

14. The process as set forth in claim 12 wherein the oxidation comprises exposing the silicon carbide structure to a mixture of hydrogen chloride gas and oxygen at a temperature of at least about 1000° C.

15. The process as set forth in claim 12 wherein the oxidized layer is chemically stripped off of the silicon carbide structure using an aqueous etching solution.

16. The process as set forth in claim 15 wherein the aqueous etching solution comprises hydrofluoric acid.

17. The process as set forth in claim 1 wherein the silicon oxide layer of step d is grown at a temperature of about 1200° C.

18. The process as set forth in claim 1 wherein the silicon oxide layer of step d is grown over a period of from about 6 hours to about 10 hours.

19. The process as set forth in claim 1 wherein the silicon oxide layer of step d is grown over a period of about 8 hours.

20. The process as set forth in claim 1 wherein the chemical stripping of step e is done with an aqueous hydrofluoric acid etchant.

21. The process as set forth in claim 20 wherein the aqueous hydrofluoric acid etchant comprises from about 0.05% (by weight) to about 49% (by weight) hydrofluoric acid.

22. The process as set forth in claim 20 wherein the stripping occurs at a temperature of from about 15° C. to about 90° C.

23. The process as set forth in claim 20 wherein the chemical stripping occurs over a time period of from about 1 minute to about 4 hours.

24. The process as set forth in claim 1 wherein the silicon carbide structure comprises a silicon carbide base structure having a high purity silicon carbide coating.

* * * * *